(12) United States Patent
Kaynak et al.

(10) Patent No.: US 9,904,594 B2
(45) Date of Patent: Feb. 27, 2018

(54) MONITORING ERROR CORRECTION OPERATIONS PERFORMED IN MEMORY

(71) Applicant: Micron Technology, Inc., Boise, ID (US)

(72) Inventors: Mustafa N. Kaynak, San Diego, CA (US); Patrick R. Khayat, San Diego, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/099,675

(22) Filed: Apr. 15, 2016

(65) Prior Publication Data

US 2017/0300377 A1    Oct. 19, 2017

(51) Int. Cl.
| | |
|---|---|
| *H03M 13/00* | (2006.01) |
| *G06F 11/10* | (2006.01) |
| *G11C 29/52* | (2006.01) |
| *H03M 13/45* | (2006.01) |
| *G11C 16/26* | (2006.01) |

(52) U.S. Cl.
CPC ........ *G06F 11/1068* (2013.01); *G11C 16/26* (2013.01); *G11C 29/52* (2013.01); *H03M 13/45* (2013.01)

(58) Field of Classification Search
CPC ..... G06F 11/1068; G11C 29/52; G11C 16/26; H03M 13/52
See application file for complete search history.

(56) References Cited

U.S. PATENT DOCUMENTS

| | | | |
|---|---|---|---|
| 6,735,726 B2 | 5/2004 | Muranaka et al. | |
| 9,092,353 B1 | 7/2015 | Micheloni et al. | |
| 2009/0319825 A1 | 12/2009 | Yang et al. | |
| 2009/0319859 A1* | 12/2009 | Alrod ................ | G06F 11/1068 714/752 |

(Continued)

FOREIGN PATENT DOCUMENTS

WO    2008109586 A1    9/2008

OTHER PUBLICATIONS

International Search Report and Written Opinion from related international application No. PCT/US2017/022897, dated Jun. 26, 2017, 10 pp.

*Primary Examiner* — Sam Rizk
(74) *Attorney, Agent, or Firm* — Brooks, Cameron & Huebsch, PLLC

(57) ABSTRACT

The present disclosure includes apparatuses and methods for monitoring error correction operations performed in memory. A number of embodiments include a memory and circuitry configured to determine a quantity of erroneous data corrected during an error correction operation performed on soft data associated with a sensed data state of a number of memory cells of the memory, determine a quality of soft information associated with the erroneous data corrected during the error correction operation performed on the soft data, and determine whether to take a corrective action on the sensed data based on the quantity of the erroneous data corrected during the error correction operation and the quality of the soft information associated with the erroneous data corrected during the error correction operation.

24 Claims, 5 Drawing Sheets

(56) References Cited

U.S. PATENT DOCUMENTS

| | | | |
|---|---|---|---|
| 2013/0290612 A1* | 10/2013 | Weathers | G11C 16/3454 711/103 |
| 2014/0380123 A1 | 12/2014 | Liikanen et al. | |
| 2015/0348619 A1 | 12/2015 | Moschiano et al. | |

* cited by examiner

MONITORING ERROR CORRECTION OPERATIONS PERFORMED IN MEMORY

TECHNICAL FIELD

The present disclosure relates generally to semiconductor memory and methods, and more particularly, to monitoring error correction operations performed in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

A state of a flash memory cell can be determined by sensing the stored charge on the charge storage structure (e.g., the Vt) of the cell. However, a number of mechanisms, such as read disturb, program disturb, cell-to-cell interference, and/or charge loss (e.g., charge leakage), for example, can cause the Vt of the memory cell to change. As a result of the change in the Vt, an error may occur when the state of the cell is sensed. For example, the cell may be sensed to be in a state other than the target state (e.g., a state different than the state to which the cell was programmed). Such errors may or may not be correctable by error correction code (ECC) schemes such as, for example, a low-density parity-check (LDPC) ECC scheme, which may utilize soft data associated with the data state of the cell to correct the error. However, errors may also occur in soft data values (e.g., bits), and these errors also may or may not be correctable by an ECC scheme.

DETAILED DESCRIPTION

Figure 1:
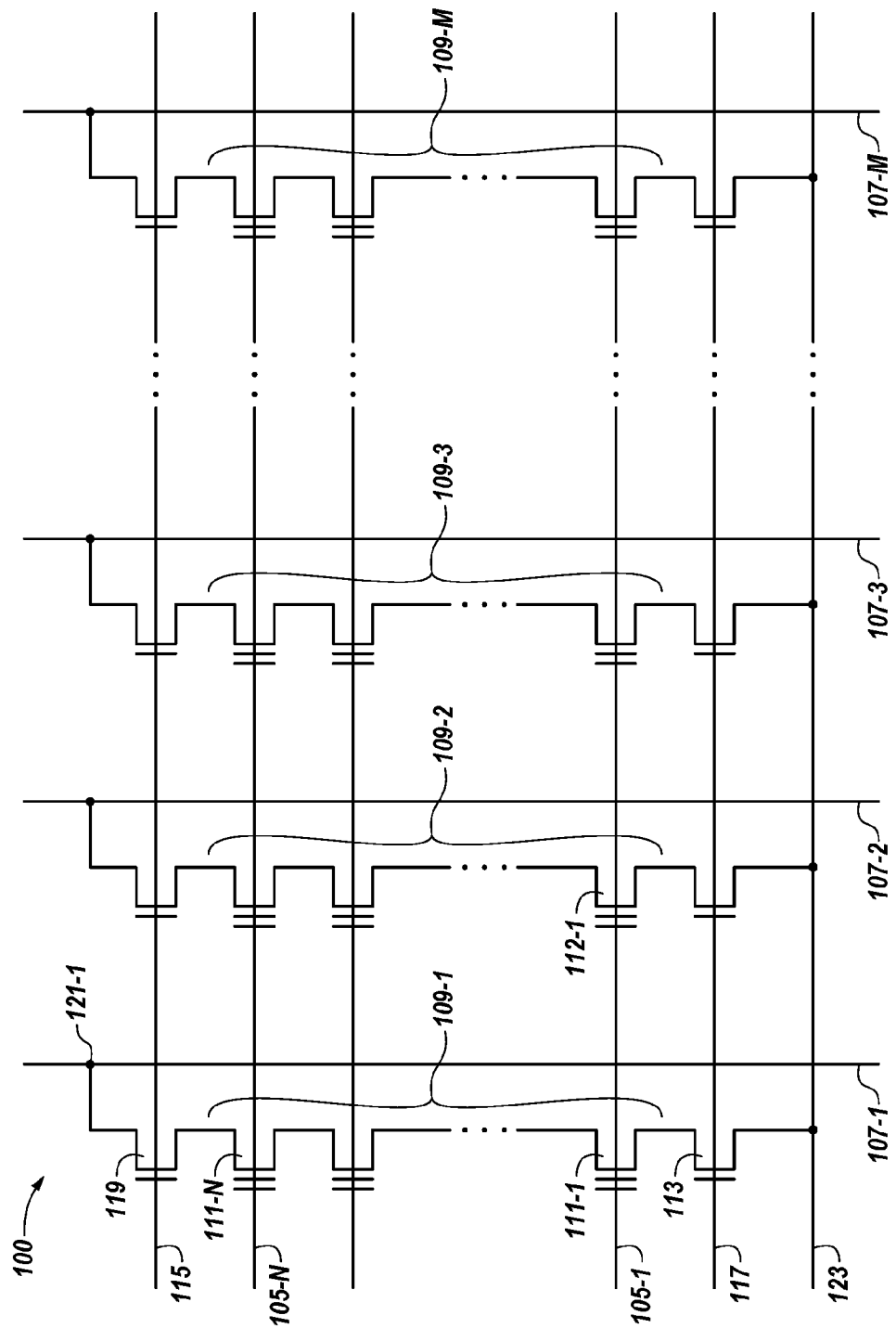
FIG. 1 illustrates a schematic diagram of a portion of a memory array in accordance with a number of embodiments of the present disclosure.

The present disclosure includes apparatuses and methods for monitoring error correction operations performed in memory. A number of embodiments include a memory and circuitry configured to determine a quantity of erroneous data corrected during an error correction operation performed on soft data associated with a sensed data state of a number of memory cells of the memory, determine a quality of soft information associated with the erroneous data corrected during the error correction operation performed on the soft data, and determine whether to take a corrective action on the sensed data based on the quantity of the erroneous data corrected during the error correction operation and the quality of the soft information associated with the erroneous data corrected during the error correction operation.

Hard data can refer to a binary data value stored in one or more memory cells and provided to a host responsive to a sense operation, for example. In various instances, soft data associated with the sensed data state (e.g., with the hard data) of the memory cell can also be determined. The soft data can, for example, indicate the quality and/or confidence of the hard data, including, for instance, information regarding the probability of the cell storing the read hard data or of the cell storing different data. Such quality and/or confidence information can be referred to herein as soft information. Accordingly, soft data can provide benefits such as increased error correction capability for the error correction code, which can translate into increased memory life, among other benefits.

Error correction operations, such as, for instance, error correction operations that utilize a low-density parity-check (LDPC) error correction code (ECC) scheme, can be used to detect and correct errors with both hard or soft data. Such error correction operations, however, may have limited correction capabilities. For instance, such error correction operations may only be capable of correcting a particular (e.g., maximum) number of errors that may occur in the data. If this correction limit is reached, (e.g., if the data has more errors than the error correction operation is capable of correcting), the error correction operation may fail, and other actions may need to be taken to recover the data.

Error correction operations can be monitored to determine whether the operations are approaching their correction limit, and, if so, appropriate corrective actions can be taken to prevent a failure of the error correction operations from occurring. For example, in the case of hard data, the performance of the error correction operation may depend solely on the quantity of erroneous data corrected during the operation. For instance, in the case of hard data, whether the error correction fails may depend solely on whether the bit error rate associated with the error correction operation meets or exceeds a particular threshold. As such, error correction operations performed on hard data can be effectively monitored based solely on the quantity of erroneous data (e.g., the bit error rate) associated therewith.

In the case of soft data, however, the performance of the error correction operations may depend on more than just the quantity of erroneous data. For example, in some instances, a particular quantity of erroneous soft data may result in an error correction operation failure, while in other instances that quantity of erroneous data may not result in an error correction operation failure. Accordingly, more than just the quantity of erroneous data (e.g., more than just the bit error rate) may be needed to effectively monitor error correction operations performed on soft data and determine whether corrective actions on the sensed data need to be taken.

Embodiments of the present disclosure can use more than just the quantity of erroneous data corrected during error correction operations performed on soft data to monitor such error correction operations and determine whether to take corrective actions. For example, embodiments of the present disclosure can use the quality of soft data, in conjunction with the quantity of the erroneous data corrected during error correction operations performed on the soft data to monitor the error correction operations and determine whether to take corrective actions. For instance, embodiments of the present disclosure can use the high reliability error rate, which will be further defined and described herein, in conjunction with the bit error rate, associated with error correction operations performed on soft data to monitor the operations and determine whether to take corrective actions on the data that has been sensed (e.g., read) from the memory. Accordingly, embodiments of the present disclosure can effectively monitor error correction operations performed on soft data as well as hard data.

As used herein, "a number of" something can refer to one or more such things. For example, a number of memory cells can refer to one or more memory cells. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 illustrates a schematic diagram of a portion of a memory array 100 in accordance with a number of embodiments of the present disclosure. The embodiment of FIG. 1 illustrates a NAND architecture non-volatile memory array. However, embodiments described herein are not limited to this example. As shown in FIG. 1, memory array 100 includes access lines (e.g., word lines 105-1, ..., 105-N) and data lines (e.g., bit lines) 107-1, 107-2, 107-3, ..., 107-M. For ease of addressing in the digital environment, the number of word lines 105-1, ..., 105-N and the number of bit lines 107-1, 107-2, 107-3, ..., 107-M can be some power of two (e.g., 256 word lines by 4,096 bit lines).

Memory array 100 includes NAND strings 109-1, 109-2, 109-3, ..., 109-M. Each NAND string includes non-volatile memory cells 111-1, ..., 111-N, each communicatively coupled to a respective word line 105-1, ..., 105-N. Each NAND string (and its constituent memory cells) is also associated with a bit line 107-1, 107-2, 107-3, ..., 107-M. The non-volatile memory cells 111-1, ..., 111-N of each NAND string 109-1, 109-2, 109-3, ..., 109-M are connected in series between a source select gate (SGS) (e.g., a field-effect transistor (FET)) 113, and a drain select gate (SGD) (e.g., FET) 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source 123. The drain of source select gate 113 is connected to memory cell 111-1 of the corresponding NAND string 109-1. The drain of drain select gate 119 is connected to bit line 107-1 of the corresponding NAND string 109-1 at drain contact 121-1. The source of drain select gate 119 is connected to memory cell 111-N (e.g., a floating-gate transistor) of the corresponding NAND string 109-1.

In a number of embodiments, construction of non-volatile memory cells 111-1, ..., 111-N includes a charge storage structure such as a floating gate, and a control gate. Non-volatile memory cells 111-1, ..., 111-N have their control gates coupled to a word line, 105-1, ..., 105-N respectively. A "column" of the non-volatile memory cells, 111-1, ..., 111-N, make up the NAND strings 109-1, 109-2, 109-3, ..., 109-M, and are coupled to a given bit line 107-1, 107-2, 107-3, ..., 107-M, respectively. A "row" of the non-volatile memory cells are those memory cells commonly coupled to a given word line 105-1, ..., 105-N. The use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates.

Subsets of cells coupled to a selected word line (e.g., 105-1, ..., 105-N) can be programmed and/or sensed (e.g., read) together (e.g., at the same time). A program operation (e.g., a write operation) can include applying a number of program pulses (e.g., 16V-20V) to a selected word line in order to increase the threshold voltage (Vt) of selected cells coupled to that selected access line to a desired program voltage level corresponding to a target (e.g., desired) data state.

A sense operation, such as a read or program verify operation, can include sensing a voltage and/or current change of a bit line coupled to a selected cell in order to determine the data state (e.g., hard data value) of the selected cell. A sense operation can also be used to determine soft data associated with the data state of the selected cell, as will be further described herein. A sense operation can include providing a voltage to (e.g., biasing) a bit line (e.g., bit line 107-1) associated with a selected memory cell above a voltage (e.g., bias voltage) provided to a source (e.g., source 123) associated with the selected memory cell. A sense operation could alternatively include precharging the bit line followed with discharge when a selected cell begins to conduct, and sensing the discharge.

Sensing the state of a selected cell can include providing a number of stepped sensing signals (e.g., stepped sensing signals that include different read voltage levels) to a selected word line while providing a number of pass signals (e.g., read pass voltages) to the word lines coupled to the unselected cells of the string sufficient to place the unselected cells in a conducting state independent of the Vt of the unselected cells. The bit line corresponding to the selected cell being read and/or verified can be sensed to determine whether or not the selected cell conducts in response to the particular sensing voltage applied to the selected word line. For example, the data state of the selected cell can be determined based on the current of the bit line corresponding to the selected cell.

When the selected cell is in a conductive state, current flows between the source contact at one end of the string and a bit line contact at the other end of the string. As such, the current associated with sensing the selected cell is carried through each of the other cells in the string and the select transistors.

Figure 2:
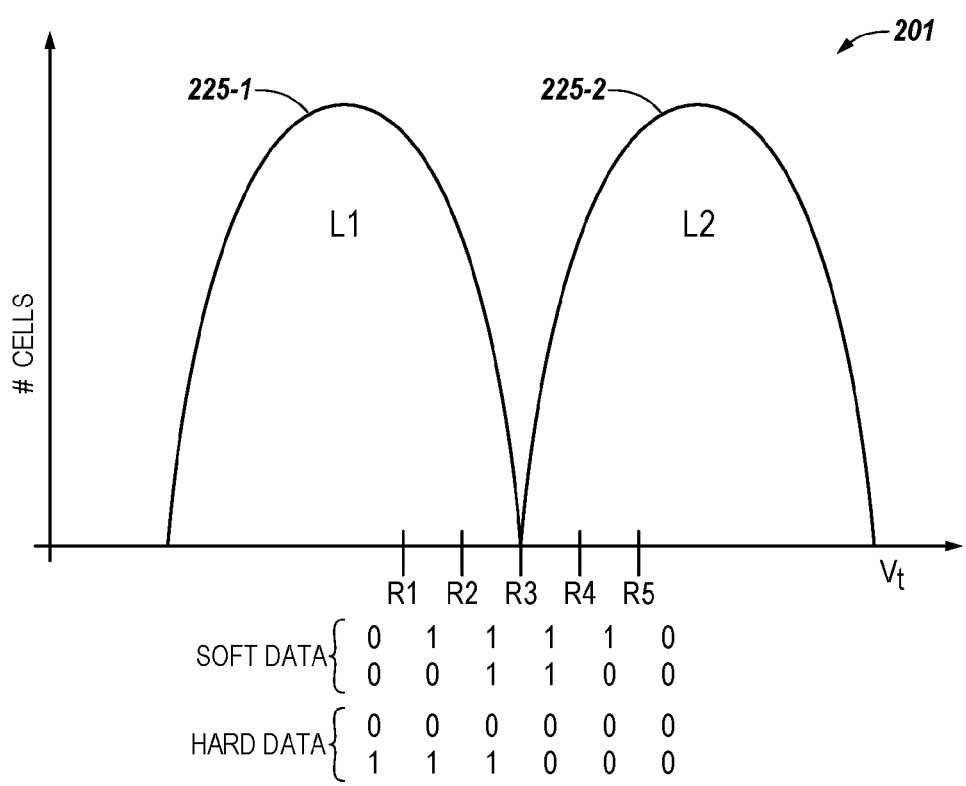
FIG. 2 illustrates a diagram of a number of threshold voltage distributions, sensing voltages, and data assignments associated with a sensing operation in accordance with a number of embodiments of the present disclosure.

FIG. 2 illustrates a diagram 201 of a number of threshold voltage (Vt) distributions, sensing voltages, and data (e.g., hard and soft data) assignments associated with a sensing operation in accordance with a number of embodiments of the present disclosure. The two Vt distributions 225-1 and 225-2 shown in FIG. 2 can correspond to two-bit (e.g., four-state) multilevel memory cells. As such, although not shown in FIG. 2, a two-bit memory cell would include two additional Vt distributions (e.g., one corresponding to each of the four data states). In this example, only the Vt distributions corresponding to data states L1 and L2 are shown. Further, embodiments of the present disclosure are not limited to two-bit multilevel memory cells. For example, embodiments of the present disclosure can include single level cells and/or other multilevel cells such as, for instance, triple level cells (TLCs) or quadruple level cells (QLCs).

As shown in FIG. 2, Vt distributions 225-1 and 225-2 represent two target data states (e.g., L1 and L2, respectively, of a four level system where R3 corresponds to the hard read position for the lower page and R1, R2, R4, and R5 correspond to sot read positions for the lower page) to which the memory cells can be programmed. In this example, data state L1 corresponds to data "01" and data state L2 corresponds to data "00". Embodiments of the present disclosure, however, are not limited to these particular data assignments. Further, although not shown in FIG. 2 for simplicity, diagram 201 could also include the two additional Vt distributions corresponding to the other two data states (e.g., L0 and L3), and the data corresponding to those data states (e.g., "11" and "10").

Vt distributions 225-1 and 225-2 can represent a number of memory cells that are programmed to the corresponding target states (e.g., L1 and L2, respectively), with the height of a Vt distribution curve indicating a number of cells programmed to a particular voltage within the Vt distribution (e.g., on average). The width of the Vt distribution curve indicates the range of voltages that represent a particular target state (e.g., the width of the Vt distribution curve 225-2 for L2 represents the range of voltages that correspond to a hard data value of 00).

During a sense (e.g., read) operation, a sensing (e.g., read) voltage located between Vt distributions 225-1 and 225-2 can be used to distinguish between states L1 and L2. In a read operation performed on a selected memory cell in a NAND string, the unselected memory cells of the string can be biased with a pass voltage so as to be in a conducting state. When all cells in a string are in a conductive state, current can flow between the source contact at one end of the string and a drain line contact at the other end of the string. As such, the data state of the selected cell can be determined based on the current sensed on a bit line corresponding to a particular string when the selected cell begins to conduct (e.g., in response to the particular read voltage applied to the control gate of the cell via a selected word line).

Each data state (e.g., L1, and L2) of the memory cells can have soft data associated therewith. For instance, the Vt distribution (e.g., 225-1 or 225-2) associated with each data state can have soft data values (e.g., bits) assigned thereto. In the example illustrated in FIG. 2, two bits are used to provide soft data associated with the data states. The soft data can be sensed using a plurality of sensing voltages, such as, for instance, reference voltages R1 to R5 illustrated in FIG. 2.

The soft data (e.g., the soft data values) associated with a data state of a memory cell can indicate the quality and/or confidence of the data state, which can be referred to herein as soft information (e.g., soft information can refer to the quality and/or confidence information indicated by the soft data). For example, soft data associated with a data state of a memory cell can indicate a location of the Vt associated with the memory cell within the Vt distribution associated with the data state of the memory cell. For example, in the embodiment illustrated in FIG. 2, soft data 00 associated with data state L2 indicates that the Vt of the memory cell is located at a voltage greater than reference voltage R5 within Vt distribution 225-2 (e.g., that the Vt of the memory cell is located toward the middle of Vt distribution 225-2), and soft data 00 associated with data state L1 indicates that the Vt of the memory cell is located at a voltage less than reference voltage R1 within Vt distribution 225-1 (e.g., that the Vt of the memory cell is located toward the middle of Vt distribution 225-1).

Additionally, soft data 10 associated with data state L2 indicates that the Vt of the memory cell is located at a voltage between reference voltages R4 and R5 within Vt distribution 225-2, and soft data 10 associated with data state L1 indicates that the Vt of the memory cell is located at a voltage between reference voltages R1 and R2 (e.g., soft data 10 indicates that the Vt of the memory cell is located closer toward the edge of the Vt distribution than soft data 00). Further, soft data 11 associated with data state L2 indicates that the Vt of the memory cell is located at a voltage between reference voltages R3 and R4, and soft data 11 associated with data state L1 indicates that the Vt of the memory cell is located at a voltage between reference voltages R2 and R3. As such, soft data 11 may indicate a lower confidence that the hard data matches the target state to which the cell was originally programmed.

Soft data (e.g., the soft data values) associated with a data state of a memory cell can also indicate a probability of whether the Vt associated with the memory cell corresponds to the data state of the memory cell. For example, in the embodiment illustrated in FIG. 2, soft data 00 associated with the data state L2 indicates a strong probability that the Vt of the memory cell corresponds to data state L2, soft data 10 associated with the data state L2 indicates a moderate probability (e.g., a probability that is less than the strong probability) that the Vt of the memory cell corresponds to data state L2, and soft data 11 associated with data state L2 indicates a weak probability (e.g., a probability that is less than the moderate probability) that the Vt of the memory cell corresponds to data state L2. Additionally, soft data 00 associated with the data state L1 indicates a strong probability that the Vt of the memory cell corresponds to data state L1, soft data 10 associated with data state L1 indicates a moderate probability that the Vt of the memory cell corresponds to data state L1, and soft data 11 associated with data state L1 indicates a weak probability that the Vt of the memory cell corresponds to data state L1.

Embodiments of the present disclosure are not limited to the reference voltages and/or soft data assignments shown in FIG. 2. For example, a greater number of soft data assignments can be used to indicate a more precise Vt location within a Vt distribution and/or a more precise probability of whether a Vt corresponds to a data state. However, for simplicity and so as not to obscure embodiments of the present disclosure, five reference voltages and six soft data values (e.g., six different soft data possibilities—three for data state L1 and three for data state L2) representing six different hard data quality and/or confidence levels have been illustrated in FIG. 2.

Figure 3:
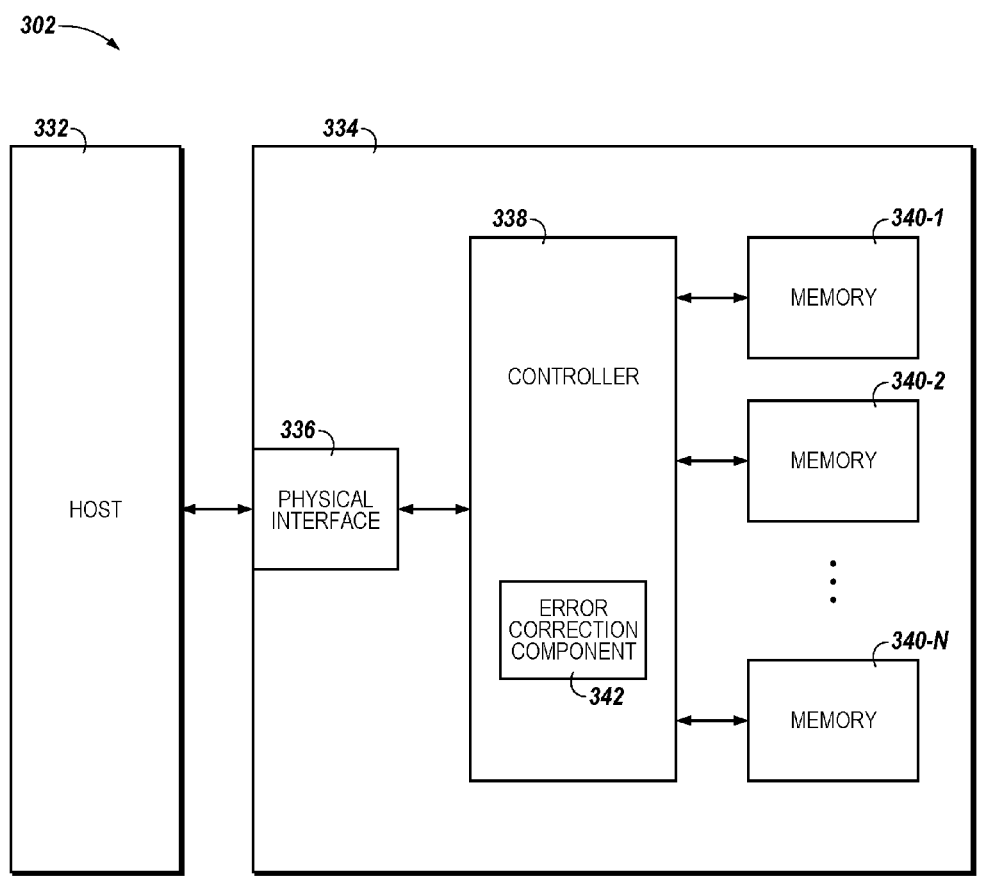
FIG. 3 is a functional block diagram of a computing system including an apparatus in the form of a memory device in accordance with a number of embodiments of the present disclosure.

FIG. 3 is a functional block diagram of a computing system 302 including an apparatus in the form of a memory device 334 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

Memory device 334 can be, for example, a solid state drive (SSD). In the embodiment illustrated in FIG. 3, memory device 334 includes a physical host interface 336, a number of memories 340-1, 340-2, . . . , 340-N (e.g., solid state memory devices), and a controller 338 (e.g., an SSD controller) coupled to physical host interface 336 and memories 340-1, 340-2, . . . , 340-N.

Memories 340-1, 340-2, . . . , 340-N can include, for example, a number of non-volatile memory arrays (e.g., arrays of non-volatile memory cells). For instance, memories 340-1, 340-2, . . . , 340-N can include a number of memory arrays analogous to memory array 100 previously described in connection with FIG. 1.

Physical host interface 336 can be used to communicate information between memory device 334 and another device such as a host 332. Host 332 can include a memory access device (e.g., a processor). One of ordinary skill in the art will appreciate that "a processor" can intend a number of processors, such as a parallel processing system, a number of coprocessors, etc. Example hosts can include personal laptop computers, desktop computers, digital cameras, digital recording and playback devices, mobile phones such as smart phones, PDAs, memory card readers, interface hubs, and the like.

Physical host interface 336 can be in the form of a standardized physical interface. For example, when memory device 334 is used for information storage in computing system 302, physical host interface 336 can be a serial advanced technology attachment (SATA) physical interface, a peripheral component interconnect express (PCIe) physical interface, or a universal serial bus (USB) physical interface, among other physical connectors and/or interfaces. In general, however, physical host interface 336 can provide an interface for passing control, address, information (e.g., data), and other signals between memory device 334 and a host (e.g., host 332) having compatible receptors for physical host interface 206.

Controller 338 can include, for example, control circuitry and/or logic (e.g., hardware and firmware). For instance, controller 338 can include error correction component 342, as illustrated in FIG. 3. Error correction component 342 can perform error correction operations to correct errors that may occur when the data state of the memory cells of memories 340-1, 340-2, . . . , 340-N are sensed, including, for instance, errors in the sensed data states and/or error in the soft data associated with the sensed data states. For example, error correction component 342 can be a low-density parity-check (LDPC) ECC component that can utilize an LDPC ECC scheme to correct the errors. Controller 338 can also communicate with memories 340-1, 340-2, . . . , 340-N to sense (e.g., read), program (e.g., write), and/or erase information, among other operations. Controller 338 can have circuitry that may be a number of integrated circuits and/or discrete components.

Controller 338 can be included on the same physical device (e.g., the same die) as memories 340-1, 340-2, . . . , 340-N. For example, controller 338 can be an application specific integrated circuit (ASIC) coupled to a printed circuit board including physical host interface 336 and memories 340-1, 340-2, . . . , 340-N. Alternatively, controller 338 can be included on a separate physical device that is communicatively coupled to the physical device that includes memories 340-1, 340-2, . . . , 340-N. In a number of embodiments, components of controller 338 can be spread across multiple physical devices (e.g., some components on the same die as the memory, and some components on a different die, module, or board) as a distributed controller.

Controller 338 can monitor error correction operations performed by error correction component 342. For example, controller 338 can monitor the performance of error correction operations performed on soft data by error correction component 342 to determine whether the operations are approaching their correction limit, and, if so, take appropriate corrective actions to prevent a failure of the future error correction operations from occurring.

For example, controller 338 can determine a quantity of erroneous soft data corrected during an error correction operation performed by error correction component 342 on soft data associated with a sensed data state of the memory cells of memories 340-1, 340-2, . . . , 340-N. The quantity of erroneous soft data can correspond to, for example, the quantity of erroneous soft data bits corrected (e.g., flipped) during the error correction operation, which can be used by controller 338 to determine the bit error rate associated with the error correction operation. For instance, a bit error rate, as used herein, can refer to the quantity of erroneous bits corresponding to an amount of erroneous data sensed from a memory during a sense operation divided by the total amount of data (e.g., total amount of hard data) sensed during the sense operation (e.g., the sample size). As such, controller 338 can determine the bit error rate associated with the error correction operation performed on the soft data by dividing the quantity of erroneous bits corrected during the error correction operation by the total quantity of soft data. As an example, in an embodiment in which error correction component 342 is an LDPC ECC component that utilizes an LDPC ECC scheme to perform the error correction operation, if error correction component 342 flips 100 bits out of a 10,000 bit codeword, the bit error rate associated with the error correction operation would be 0.01.

The performance of error correction operations performed on soft data, however, may depend on more than just the quantity of erroneous soft data corrected during the error correction operation, as previously described herein. For example, the performance of error correction operations performed on soft data (e.g., whether the operations may fail) may also depend on the quality of the soft information associated with (e.g., indicated by) the erroneous soft data. As such, controller 338 may also determine the quality of the soft information associated with the erroneous soft data corrected during the error correction operation performed by error correction component 342 on the soft data.

The quality of the soft information associated with the corrected erroneous soft data can correspond to, for example, the high reliability error rate associated with the error correction operation. The high reliability error rate associated with the error correction operation can refer to the quantity of the soft data errors (e.g., erroneous bits) corrected during the error correction operation that are high reliability errors divided by the total amount of soft data sensed during the sense operation (e.g., the sample size). For example, referring to FIG. 2, high reliability errors may correspond to the portion of the left tail of Vt distribution 225-2 (e.g., data state L2) that is less than reference voltage R1, and the portion of the right tail of Vt distribution 225-1 (e.g., data state L1) that is greater than reference voltage R5. Both cases of this example result in erroneous bits that are assigned soft data 00, which indicates high reliability. As such, controller 338 can determine the high reliability error rate by determining how many of the erroneous soft data bits corrected during the error correction operation are high reliability errors, and dividing that quantity by the total quantity of soft data. To continue the previous example, if controller 338 determines that 20 of the 100 erroneous bits flipped by error correction component 342 are high reliability errors, the high reliability error rate associated with the error correction operation would be 0.002.

Whether a soft data error is a high reliability error, and hence the quality of the soft information associated with erroneous soft data, can correspond to the quality and/or confidence information (e.g., level) associated with the sensed data state of the memory cell that is indicated by that soft data. For example, whether a soft data error is a high reliability error, and hence the quality of the soft information associated with the erroneous soft data, can correspond to the threshold voltage location that is indicated by that soft data. For instance, a soft data error can be classified as a high reliability error if that soft data indicates that the threshold voltage associated with that memory cell is located at a voltage that is greater than the highest sensing voltage that may be used to sense the soft data (e.g., greater than reference voltage R5 for data state L1 illustrated in FIG. 2), or if that soft data indicates that the threshold voltage associated with that memory cell is located at a voltage that is less than the lowest sensing voltage that may be used to sense the soft data (e.g., less than reference voltage R1 for data state L2 illustrated in FIG. 2). Hence, referring to the example illustrated in FIG. 2, an error in soft data 00 associated with data state L1 or L2 would be a high reliability error, while an error in soft data 10 or 11 associated with data state L1 or L2 would not be a high reliability error. As an additional example, a high reliability error can be defined as a bit that is in error and has a Vt that is a particular voltage amount (e.g., millivolts) away from the voltage used to sense the data state of the memory cell (e.g., reference voltage R3 illustrated in FIG. 2).

As an additional example, whether a soft data error is a high reliability error, and hence the quality of the soft data associated with the erroneous soft data, can correspond to the probability that is indicated by that soft data. For instance, a soft data error can be classified as a high reliability error if that soft data indicates that the threshold voltage associated with that memory cell has the strongest probability of corresponding to the data state of that cell. Hence, referring again to the example illustrated in FIG. 2, an error in soft data 00 associated with data state L1 or L2 would again be a high reliability error, as that soft data indicates the strongest probability (e.g., stronger than the probability indicated by soft data 10 and 11) the threshold voltage corresponds to that data state.

Controller 338 can then determine whether to take a corrective action on the sensed data (e.g., whether the operation is approaching its correction limit and may fail) based on both the quantity and quality of the erroneous soft data corrected during the error correction operation. For example, controller 338 can determine whether to take the corrective action based on both the bit error rate and the high reliability error rate associated with the error correction operation. The corrective action can be, for example, a relocation of the sensed (e.g., read) data to a different location in memories 340-1, 340-2, . . . , 340-N. For instance, the data can be programmed to and/or stored in a different page, block, or die of memories 340-1, 340-2, . . . , 340-N.

As an example, controller 338 can plot a data point corresponding to the bit error rate and the high reliability error rate in a two-dimensional bit error rate versus high reliability error rate space, and determine whether to take the corrective action based on the location of the data point in the space. For instance, the two-dimensional bit error rate versus high reliability error rate space can include a curve corresponding to the correction limit of the error correction operation performed on the soft data (e.g., the limit of the correction capabilities of error correction component 342), and controller 338 can determine whether to take the corrective action based on the location of the data point relative to the curve (e.g., based on which side of the curve the data point is on) in the space. For example, controller 338 may take the corrective action if the data point is located on a first side of the curve, and may not take the corrective action if the data point is located on a second side of the curve. The curve can be a pre-generated curve provided to controller 338, or the curve can be generated by controller 338 during operation of memory device 334 (e.g. on the fly) based on the results of previous error correction operations performed on soft data by error correction component 342.

As an additional example, the two-dimensional bit error rate versus high reliability error rate space may also include a number of additional curves, each corresponding to a different margin amount associated with the curve that corresponds to the correction limit of the error correction operation, and controller 338 can determine whether to take the corrective action based on the location of the data point relative to the number of additional curves as well. An example of such a two-dimensional bit error rate versus high reliability error rate space with such curves that can be used to determine whether to take the corrective action will be further described herein (e.g., in connection with FIG. 4).

The embodiment illustrated in FIG. 3 can include additional circuitry, logic, and/or components not illustrated so as not to obscure embodiments of the present disclosure. For example, memory device 334 can include address circuitry to latch address signals provided over I/O connectors through I/O circuitry. Address signals can be received and decoded by a row decoder and a column decoder, to access memories 340-1, 340-2, . . . , 340-N.

Figure 4:
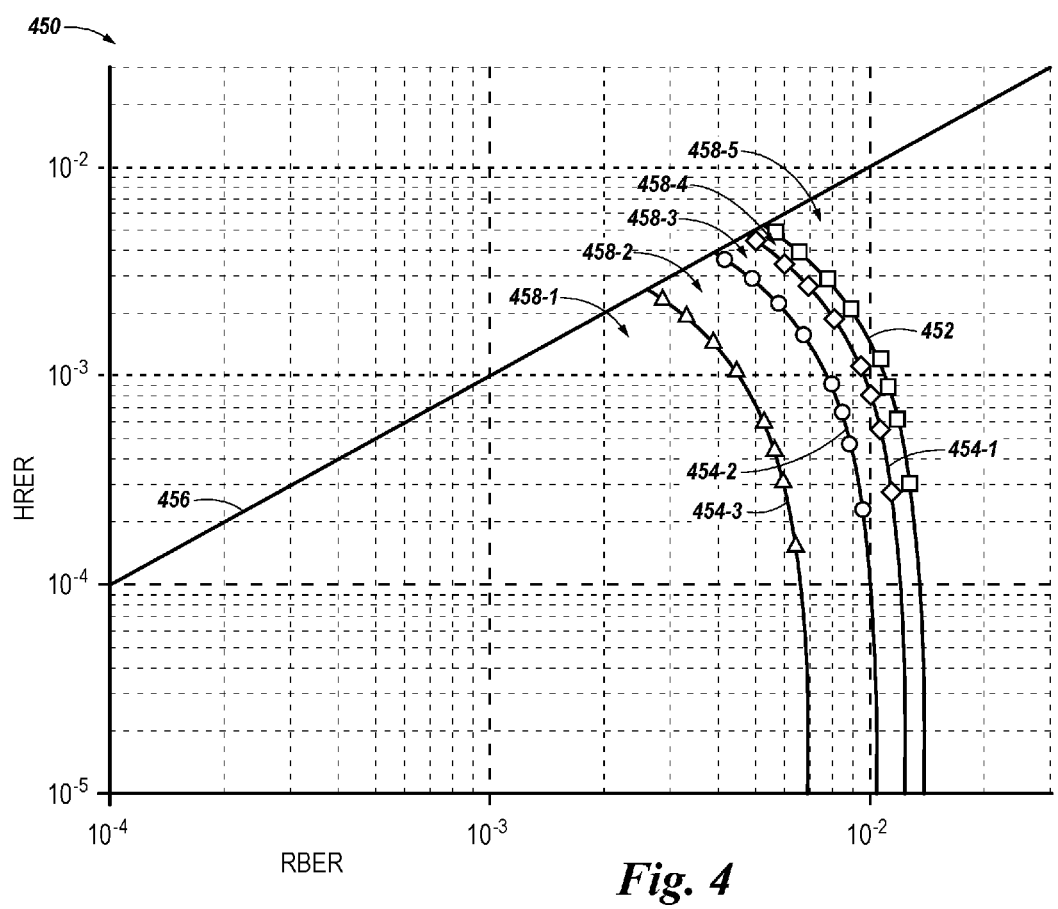
FIG. 4 illustrates an example of a two-dimensional bit error rate versus high reliability error rate space in accordance with a number of embodiments of the present disclosure.

FIG. 4 illustrates an example of a two-dimensional bit error rate versus high reliability error rate space 450 in accordance with a number of embodiments of the present disclosure. For instance, in the example illustrated in FIG. 4, two-dimensional space 450 comprises a log-log scale graph, with bit error rate on the x-axis and high reliability error rate on the y-axis. As such, the x-coordinate of a data point plotted in two-dimensional space 450 would correspond to bit error rate, and the y-coordinate of a data point plotted in two-dimensional space 450 would correspond to high reliability error rate. For example, line 456 illustrates where the bit error rate (e.g., x-coordinate) and high reliability error rate (e.g., y-coordinate) are equal in two-dimensional space 450.

Two-dimensional space 450 can be used, for example, by controller 338 previously described in connection with FIG. 3 to monitor the performance of error correction operations performed on soft data, including determining whether the operations are approaching their correction limit and corrective actions should be taken. For instance, controller 338 can plot a data point in two-dimensional space 450 corresponding to a determined bit error rate and high reliability error rate (e.g., the x-coordinate of the data point would be the bit error rate, and the y-coordinate of the data point would be the high reliability error rate) associated with an error correction operation performed on soft data, and can determine whether to take a corrective action on the sensed data based on the location of the data point in the space.

For example, as shown in FIG. 4, two-dimensional space 450 includes a curve 452 extending downward from line 456. Curve 452 can correspond to the correction limit of the error correction operation performed on the soft data, and can be pre-generated or generated on the fly, as previously described herein (e.g., in connection with FIG. 3). In a number of embodiments, controller 338 may determine whether to take a corrective action on the sensed data based on which side of curve 452 the plotted bit error rate-high reliability error rate data point is on. For instance, controller 338 may take the corrective action if the data point is to the right of curve 452 in two-dimensional space 450, and may not take the corrective action if the data point is to the left of curve 452 in two-dimensional space 450. For instance, to continue the previous example in which the bit error rate was determined to be 0.01 and the high reliability error rate was determined to be 0.002, the data point (e.g., 0.01, 0.002) would be on the right side of curve 452, which would result in controller 338 taking corrective action.

In a number of embodiments, two-dimensional space 450 can also include a number of additional curves extending downward from line 456. For example, in the embodiment illustrated in FIG. 4, two-dimensional space 450 includes three additional curves 454-1, 454-2, and 454-3. However, embodiments of the present disclosure are not limited to a particular number of additional curves. Each respective additional curve can correspond to a different margin amount associated with (e.g., from) curve 452. For example, in the embodiment illustrated in FIG. 4, curve 454-1 can correspond to a 10% margin from curve 452, curve 454-2 can correspond to a 25% margin from curve 452, and curve 454-3 can correspond to a 50% margin from curve 452. However, embodiments of the present disclosure are not limited to particular margin amounts. These margin amounts can add a guard band against unaccounted noise sources, for example.

The curves in two-dimensional space 450 can split the space into a number of regions. For example, in the embodiment illustrated in FIG. 4, two-dimensional space 450 includes region 458-1 to the left of curve 454-3, region 458-2 between curves 454-2 and 454-3, region 458-3 between curves 454-1 and 454-2, region 458-4 between curves 452 and 454-1, and region 458-5 to the right of curve 452. Each region (e.g., the portion of two-dimensional space 450 included within each respective region) can correspond to a different probability that an error correction operation performed on soft data will fail (e.g., that the error correction operation will not be able to correctly decode the errors in the soft data). For example, an error correction operation whose bit error rate-high reliability error rate data point falls in region 458-1 may have a very low probability of failing, an error correction operation whose bit error rate-high reliability error rate data point falls in region 458-2 may have a low probability (e.g., a probability that is greater than the very low probability) of failing, an error correction operation whose bit error rate-high reliability error rate data point falls in region 458-3 may have a moderate probability (e.g., a probability that is greater than the low probability) of failing, an error correction operation whose bit error rate-high reliability error rate data point falls in region 458-4 may have a strong probability (e.g., a probability that is greater than the moderate probability) of failing, and an error correction operation whose bit error rate-high reliability error rate data point falls in region 458-5 may have a very strong probability (e.g., a probability that is greater than the strong probability) of failing.

In a number of embodiments, controller 338 may determine whether to take a corrective action on the sensed data based on which region the plotted bit error rate-high reliability error rate data point falls in. As an example, controller 338 may take the corrective action if the data point falls in region 458-5, and may not take the corrective action if the data point falls in regions 458-4, 458-3, 458-2, or 458-1. As an additional example, controller 338 may take the corrective action if the data point falls in regions 458-5 or 458-4, and may not take the corrective action if the data point falls in regions 458-3, 458-2, or 458-1. As an additional example, controller 338 may take the corrective action if the data point falls in regions 458-5, 458-4, or 458-3 and may not take the corrective action if the data point falls in regions 458-2 or 458-1. The determination of which region or regions the data point needs to fall in for controller 338 to determine to take the corrective action can depend, for example, on the current operating and/or performance level of the memory. For instance, the greater the operating and/or performance level of the memory, the more regions that will result in the corrective action being taken.

Figure 5:
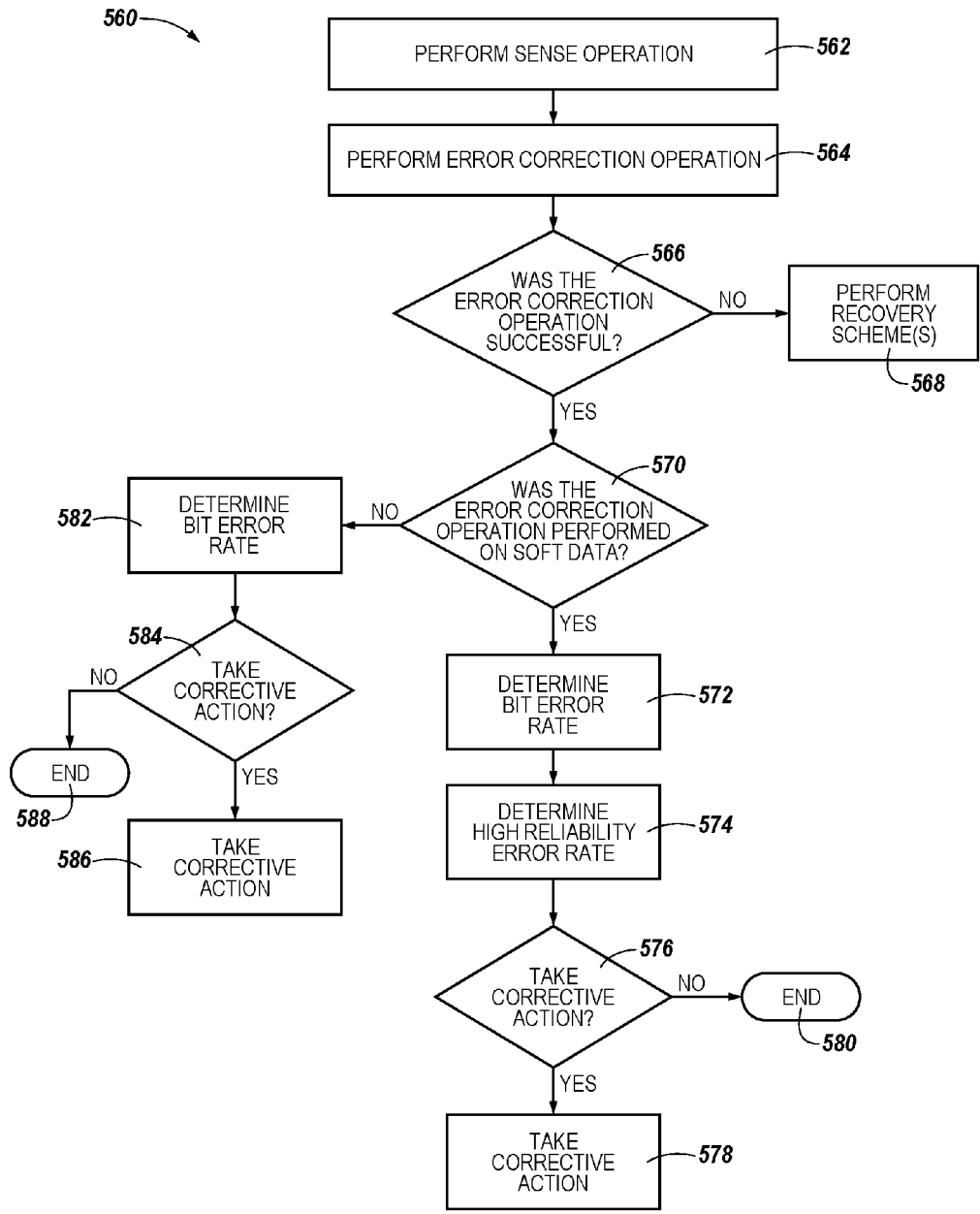
FIG. 5 illustrates a method for operating memory in accordance with a number of embodiments of the present disclosure.

FIG. 5 illustrates a method 560 for operating memory (e.g., memories 340-1, 340-2, . . . , 340-N previously described in connection with FIG. 3) in accordance with a number of embodiments of the present disclosure. Method 560 can be performed by, for example, controller 338 previously described in connection with FIG. 3. Method 560 can be used, for example, to monitor the performance of error correction operations performed on hard and soft data, including determining whether the operations are approaching their correction limit and corrective actions should be taken.

At block 562, method 560 includes performing a sense operation to sense the data state of the cells of the memory, and soft data associated with the sensed data states. In a number of embodiments, the data state of each respective cell, and the soft data associated with the data state of each respective memory cell, can be sensed during the same sense operation. The data states, and the soft data associated therewith, can be sensed using a plurality of sensing voltages, as previously described herein. For example, the soft data can be sensed using reference voltages R1 to R5 illustrated in FIG. 2.

At block 564, method 560 includes performing an error correction operation on the sensed data states and/or the soft data associated therewith to correct errors therein. Performing an error correction on the soft data can include performing an LDPC operation on the soft data, as previously described herein. However, embodiments of the present disclosure are not limited to a particular type of ECC scheme (e.g., the error correction operation can be performed using other types of ECC schemes).

At block 566, method 560 includes determining whether the error correction operation was successful (e.g., whether the error correction operation was able to correctly decode the errors in the sensed data states and/or soft data). If it is determined that the error correction operation was not successful, then a number of recovery schemes, such as, for instance, a read-retry recovery scheme, a corrective read recovery scheme, and/or a redundant array of independent NAND (RAIN) recovery scheme, can be performed at block 568 to attempt to recover the data. If it is determined that the error correction was successful, then it can be determined whether the error correction operation was performed on soft data at block 570.

If it is determined that the error correction operation was performed on soft data, then the bit error rate associated with the error correction operation can be determined at block 572, and the high reliability error rate associated with the error correction operation can be determined at block 574. The bit error rate associated with the error correction operation can be determined, for example, using the quantity of erroneous soft data bits corrected during the error correction operation (e.g., by the ECC scheme), and the high reliability error rate can be determined, for example, based on the quantity of the soft data errors corrected during the error correction operation that are high reliability errors, as previously described herein.

At block 576, method 560 includes determining whether to take a corrective action on the sensed data. This determination can be made based on the bit error rate and the high reliability error rate associated with the error correction operation, as previously described herein. For example, this determination can be made by plotting the bit error rate and high reliability error rate in two-dimensional space 450 having curves 452 and/or 454-1, 454-2, and 454-3, as previously described in connection with FIG. 4. As an additional example, this determination can be look-up table based. For instance, this determination can be made by looking up the bit error rate and high reliability error rate in a look-up table. If it is determined not to take a corrective action on the soft data, no corrective action is taken, and method 560 ends at block 580. If it is determined to take a corrective action, the corrective action is taken at block 578. The corrective action can include, for example, a relocation of the sensed data, as previously described herein.

If it is determined that the error correction operation was not performed on soft data at block 570 (e.g., the error correction operation was performed on the sensed data states), then the bit error rate associated with the error correction operation performed on the sensed data states can be determined at block 582. The bit error rate can refer to the quantity of erroneous bits corresponding to an amount of erroneous hard data sensed during the sense operation performed at block 562 divided by the total amount of hard data sensed during the sense operation (e.g., the sample size). As such, the bit error rate associated with the error correction operation performed on the sensed data states can be determined by dividing the quantity of erroneous bits corrected during the error correction operation by the total quantity of hard data.

At block 584, method 560 includes determining whether to take a corrective action on the sensed data states (e.g., the hard data). This determination can be made based on the bit error rate associated with the error correction operation performed at block 564. For example, this determination can be based on whether the bit error rate associated with the error correction operation meets or exceeds a threshold bit error rate. The threshold bit error rate can correspond to the correction limit of the error correction operation (e.g., the amount of errors the operation is capable of correcting).

If it is determined not to take a corrective action on the sensed data states, no corrective action is taken, and method 560 ends at block 588. If it is determined to take a corrective action, the corrective action is taken at block 586. The corrective action can include, for example, a relocation of the data to a different location in the memory. For instance, the data can be programmed to and/or stored in a different page, block, or die of the memory.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. An apparatus, comprising:
a memory; and
circuitry configured to:
  sense a data state of a number of memory cells of the memory and soft data associated with the sensed data states;
  perform an error correction operation on the sensed data states and soft data;
  determine, if the error correction operation is successful, a bit error rate associated with the error correction operation based on a quantity of erroneous soft data corrected during the error correction operation;
  determine, if the error correction operation is successful, a high reliability error rate associated with the error correction operation based on a quality of the erroneous soft data corrected during the error correction operation; and determine whether to take a corrective action on the sensed data states based on the bit error rate associated with the error correction operation and the high reliability error rate associated with the error correction operation.

2. The apparatus of claim 1, wherein:
the high reliability error rate corresponds to a quantity of errors corrected during the error correction operation that are high reliability errors; and
an error corrected during the error correction operation is a high reliability error if the soft data having that error indicates that a threshold voltage associated with that memory cell is a particular voltage amount away from a voltage used to sense the data state of that memory cell.

3. The apparatus of claim 1, wherein the circuitry is configured to perform a sense operation to sense the data state of each respective memory cell and the soft data associated with the sensed data state of each respective memory cell.

4. The apparatus of claim 1, wherein the corrective action on the sensed data states is a relocation of the sensed data states to a different location in the memory.

5. An apparatus, comprising:
a memory; and
circuitry configured to:
sense a data state of a number of memory cells of the memory and soft data associated with the sensed data states;
perform an error correction operation on the sensed data states and soft data;
determine, if the error correction operation is successful, a bit error rate associated with the error correction operation;
determine, if the error correction operation is successful, a high reliability error rate associated with the error correction operation; and
determine whether to take a corrective action on the sensed data states based on the bit error rate associated with the error correction operation and the high reliability error rate associated with the error correction operation.

6. The apparatus of claim 5, wherein the circuitry is configured to determine whether to take the corrective action based on a location of a data point corresponding to the bit error rate and the high reliability error rate in a two-dimensional bit error rate versus high reliability error rate space.

7. The apparatus of claim 6, wherein:
the two-dimensional bit error rate versus high reliability error rate space includes a curve corresponding to a correction limit of the error correction operation; and
the circuitry is configured to determine whether to take the corrective action based on the location of the data point relative to the curve in the two-dimensional bit error rate versus high reliability error rate space.

8. The apparatus of claim 7, wherein:
the two-dimensional bit error rate versus high reliability error rate space includes a number of additional curves, wherein each respective additional curve corresponds to a different margin amount associated with the curve that corresponds to the correction limit of the error correction operation; and
the circuitry is configured to determine whether to take the corrective action based on the location of the data point relative to the number of additional curves in the two-dimensional bit error rate versus high reliability error rate space.

9. The apparatus of claim 7, wherein the circuitry is configured to generate the curve based on previous error correction operations performed on soft data by the circuitry.

10. The apparatus of claim 7, wherein the curve is a pre-generated curve.

11. A method for operating memory, comprising:
sensing a data state of a number of memory cells and soft data associated with the sensed data states;
performing an error correction operation on the sensed data states and soft data;
determining, if the error correction operation is successful, a bit error rate associated with the error correction operation based on a quantity of erroneous soft data corrected during the error correction operation;
determining, if the error correction operation is successful, a high reliability error rate associated with the error correction operation based on a quality of the erroneous soft data corrected during the error correction operation; and
determining whether to take a corrective action on the sensed data states based on the bit error rate associated with the error correction operation and the high reliability error rate associated with the error correction operation.

12. The method of claim 11, wherein the method includes:
taking the corrective action if a location of a data point corresponding to the quantity of the erroneous soft data and the quality of the erroneous soft data in a two-dimensional quantity versus quality of erroneous data space is on a first side of a curve in the two-dimensional space corresponding to a correction limit of the error correction operation; and
not taking the corrective action if the location of the data point is on a second side of the curve in the two-dimensional space.

13. The method of claim 11, wherein:
the soft data associated with the sensed data state of each respective memory cell indicates a location of a threshold voltage associated with that memory cell within a threshold voltage distribution associated with the data state of that memory cell; and
the quality of the erroneous soft data corrected during the error correction operation corresponds to the threshold voltage location indicated by the erroneous soft data.

14. The method of claim 11, wherein:
the soft data associated with the sensed data state of each respective memory cell indicates a probability of whether a threshold voltage associated with that memory cell corresponds to the data state of that memory cell; and
the quality of the erroneous soft data corrected during the error correction operation corresponds to the probability indicated by the erroneous soft data.

15. The method of claim 11, wherein performing the error correction operation on the soft data includes performing a low-density parity-check (LDPC) operation on the soft data.

16. The method of claim 11, wherein the method includes performing the error correction operation on the soft data using an error correction code (ECC) scheme other than a low-density parity-check (LDPC) ECC scheme.

17. A method for operating memory, comprising:
sensing a data state of a number of memory cells and soft data associated with the sensed data states;
performing an error correction operation on the sensed data states and the soft data to correct errors in the soft data;
determining, if the error correction operation is successful, a bit error rate associated with the error correction operation;
determining, if the error correction operation is successful, a high reliability error rate associated with the error correction operation; and
determining whether to take a corrective action based on the bit error rate associated with the error correction operation and the high reliability error rate associated with the error correction operation.

18. The method of claim 17, wherein the method includes determining the high reliability error rate associated with the error correction operation based on a quantity of the errors in the soft data corrected during the error correction operation that are high reliability errors.

19. The method of claim 18, wherein an error in the soft data corrected during the error correction operation is a high reliability error if the soft data having that error indicates that a threshold voltage associated with that memory cell is a particular voltage amount away from a voltage used to sense the data state of that memory cell.

20. The method of claim 18, wherein:
the method includes sensing the soft data associated with the sensed data state of each respective memory cell using a plurality of sensing voltages; and
an error in the soft data corrected during the error correction operation is a high reliability error if:
the soft data having that error indicates that a threshold voltage associated with that memory cell is located at a voltage greater than the highest one of the plurality of sensing voltages; or
the soft data having that error indicates that the threshold voltage associated with that memory cell is located at a voltage less than the lowest one of the plurality of sensing voltages.

21. The method of claim 18, wherein:
the method includes sensing the soft data associated with the sensed data state of each respective memory cell using a plurality of sensing voltages; and
an error in the soft data corrected during the error correction operation is a high reliability error if the soft data having that error indicates that a threshold voltage associated with that memory cell has a strongest probability of corresponding to the data state of that memory cell.

22. The method of claim 17, wherein the method includes sensing the data state of each respective memory cell and the soft data associated with the data state of each respective memory cell during a same sense operation.

23. The method of claim 17, wherein the method includes determining whether to take the corrective action based on whether the bit error rate associated with the error correction operation meets or exceeds a threshold bit error rate.

24. The method of claim 17, wherein the corrective action is a relocation of the sensed data states to a different location in the memory.

* * * * *